US012590476B2

(12) United States Patent  
Scheibe et al.

(10) Patent No.: US 12,590,476 B2  
(45) Date of Patent: Mar. 31, 2026

(54) BENDING PRINTED CIRCUIT BOARDS

(71) Applicant: HELLA GMBH & CO. KGAA, Lippstadt (DE)

(72) Inventors: Winfried Scheibe, Lippstadt (DE); Sandra Ritterswuerden, Lippstadt (DE); Stefan Werner, Bocholt (DE)

(73) Assignee: Hella GmbH & Co. KGaA, Lippstadt (DE)

( * ) Notice: Subject to any disclaimer, the term of this patent is extended or adjusted under 35 U.S.C. 154(b) by 1331 days.

(21) Appl. No.: 17/121,255

(22) Filed: Dec. 14, 2020

(65) Prior Publication Data

US 2021/0102415 A1 Apr. 8, 2021

Related U.S. Application Data

(63) Continuation of application No. PCT/EP2019/064179, filed on May 31, 2019.

(30) Foreign Application Priority Data

Jun. 12, 2018 (DE) ..................... 10 2018 113 946.2

(51) Int. Cl.  
*E05B 81/76* (2014.01)  
*E05B 85/10* (2014.01)  
(Continued)

(52) U.S. Cl.  
CPC .............. *E05B 81/77* (2013.01); *E05B 85/10* (2013.01); *H01Q 1/3241* (2013.01); *H01Q 1/38* (2013.01);  
(Continued)

(58) Field of Classification Search  
CPC .......... E05B 81/77; E05B 81/78; E05B 85/10; H01Q 1/3241; H01Q 1/38; H05K 1/028;  
(Continued)

(56) References Cited

U.S. PATENT DOCUMENTS 5,434,362 A 7/1995 Klosowiak et al.  
6,292,370 B1 * 9/2001 Anderson ............ H05K 3/0014  
361/752

(Continued)

FOREIGN PATENT DOCUMENTS

CN 212231805 U * 12/2020  
DE 102006025075 A1 12/2007  
(Continued)

OTHER PUBLICATIONS

International Search Report dated Aug. 19, 2019 in corresponding application PCT/EP2019/064179.

*Primary Examiner* — William L Miller  
(74) *Attorney, Agent, or Firm* — Muncy, Geissler, Olds & Lowe, P.C.

(57) ABSTRACT

A printed circuit board having essentially a first region, a second region, and a third region. The first region and the third region can be used for the placement of electrical and/or electronic components. The second region located in the middle of the three regions is a bend region. A side edge of the printed circuit board is offset inward in this region in order to narrow the contour of the printed circuit board in the bend region. This region likewise has one or more through holes. Both the narrowing and the through holes facilitate a bending of the printed circuit board, namely a bending of the first region relative to the third region or vice versa.

13 Claims, 1 Drawing Sheet

(51) Int. Cl.
| | | |
|---|---|---|
| *H01Q 1/32* | (2006.01) | |
| *H01Q 1/38* | (2006.01) | |
| *H05K 1/02* | (2006.01) | |

(52) U.S. Cl.
CPC .......... *H05K 1/028* (2013.01); *E05Y 2400/66* (2013.01); *E05Y 2400/86* (2013.01); *E05Y 2600/41* (2013.01); *E05Y 2900/531* (2013.01); *H05K 2201/10098* (2013.01)

(58) Field of Classification Search
CPC ...... H05K 2201/10098; E05Y 2400/66; E05Y 2400/86; E05Y 2600/41; E05Y 2900/531
USPC .......................................................... 16/412
See application file for complete search history.

(56) References Cited

U.S. PATENT DOCUMENTS

| | | | | |
|---|---|---|---|---|
| 6,841,739 B2 * | 1/2005 | Moore | ................. | H05K 1/0393 |
| | | | | 219/209 |
| 6,927,344 B1 * | 8/2005 | Gall | .................... | H05K 1/0278 |
| | | | | 174/254 |
| 7,075,794 B2 * | 7/2006 | Gall | .................... | H05K 1/0281 |
| | | | | 361/795 |
| 8,975,527 B2 * | 3/2015 | Takaoka | ................. | H05K 1/028 |
| | | | | 174/254 |

| | | | | |
|---|---|---|---|---|
| 9,745,778 B1 * | 8/2017 | Bingle | .................... | E05B 81/77 |
| 9,769,920 B2 * | 9/2017 | Ely | ....................... | H05K 1/0281 |
| 10,147,252 B2 | 12/2018 | Schindler et al. | | |
| 10,237,970 B2 * | 3/2019 | Salter | .................... | H05K 3/0047 |
| 11,109,478 B2 * | 8/2021 | Klenk | ................. | B62D 5/0406 |
| 2008/0018127 A1 * | 1/2008 | Schindler | ............... | E05B 81/78 |
| | | | | 296/1.02 |
| 2018/0300975 A1 * | 10/2018 | Oberbeckmann | .... | H01Q 1/3283 |
| 2019/0097322 A1 | 3/2019 | Suzuki et al. | | |
| 2019/0226248 A1 * | 7/2019 | Kalesse | ............... | H01Q 1/3241 |
| 2021/0123270 A1 * | 4/2021 | Spick | ...................... | E05B 81/76 |
| 2021/0160998 A1 * | 5/2021 | Sieg | ........................ | E05B 81/77 |
| 2021/0293061 A1 * | 9/2021 | Blank | .................... | E05B 81/77 |
| 2021/0302147 A1 * | 9/2021 | Chabrowski | ........... | E05B 81/77 |
| 2022/0052446 A1 * | 2/2022 | Lin | ........................ | H01Q 21/28 |
| 2023/0175305 A1 * | 6/2023 | Gorenzweig | ........ | H03K 17/955 |
| | | | | 49/31 |

FOREIGN PATENT DOCUMENTS

| | | | | | |
|---|---|---|---|---|---|
| DE | 102012100428 | A1 | 7/2013 | | |
| DE | 102014113832 | A1 | 3/2016 | | |
| FR | 2748161 | A1 | 10/1997 | | |
| FR | 2920916 | A1 * | 3/2009 | ............ | E05B 81/78 |
| WO | WO03071069 | A1 | 8/2003 | | |
| WO | WO-2004007879 | A1 * | 1/2004 | ............ | E05B 81/78 |
| WO | WO2017208828 | A1 | 12/2017 | | |

* cited by examiner

BENDING PRINTED CIRCUIT BOARDS

This nonprovisional application is a continuation of International Application No. PCT/EP2019/064179, which was filed on May 31, 2019, and which claims priority to German Patent Application No. 10 2018 113 946.2, which was filed in Germany on Jun. 12, 2018, and which are both herein incorporated by reference.

BACKGROUND OF THE INVENTION

Field of the Invention

The present invention relates to a printed circuit board, a sensor group with the printed circuit board, and a door handle with the sensor group.

Description of the Background Art

Door handles with sensor groups, which have antennas, in particular, are known from the prior art, for example from the documents DE 10 2006 025 075 A1, DE 10 2014 113 832 A1 (which corresponds to US2017/0243423), and DE 10 2012 100 428 A1.

It has become apparent that it is especially advantageous when the antenna is matched to a contour of an external surface of the door handle. If the antenna is matched to the contour of an external surface of the door handle, it can be arranged very close to the external surface of the door handle. In order to be able to match an antenna arranged as a conductive trace on a printed circuit board to the contour of the external surface of the door handle, it is helpful if it is possible to bend the printed circuit board. Bendable printed circuit boards are known from the prior art. However, bendable or flexible printed circuit boards are more expensive than, for example, the widely used FR4 printed circuit boards, which are rigid as compared to flexible printed circuit boards.

The inventors were confronted with the problem of finding a solution for achieving a matching of the antenna provided as a conductive trace on the printed circuit board to a curved contour, even with a printed circuit board that is not flexible. In other words, the inventors were confronted with the problem of bending a rigid printed circuit board.

SUMMARY OF THE INVENTION

It is therefore an object of the invention to provide a printed circuit board that has a bend region, which has a narrowing and/or a through hole, wherein the printed circuit board has a side edge, wherein the side edge is set back inward for the narrowing of the printed circuit board in the bend region.

Because of the narrowing and/or the through holes, a printed circuit board according to the invention, in particular an FR4 printed circuit board, is bendable in the bend region. As a result, the printed circuit board can be bent in order to give a curved contour to the printed circuit board and to an antenna arranged thereon that is composed of conductive traces.

The printed circuit board can have at least two regions, preferably three regions, including the bend region, wherein the bend region preferably is a middle region of the three regions. Consequently, a bending of the printed circuit board is possible in a middle region.

An antenna, in particular an NFC antenna, or parts of an antenna, in particular parts of an NFC antenna, can be arranged on the printed circuit board. The antenna can be arranged, in particular, in the bend region of the printed circuit board, where the printed circuit board can best be bent to follow an arched contour. The antenna can fully or partially surround the through holes in the bend region.

The printed circuit board according to the invention can have supply lines, wherein the supply lines of the antenna can be arranged in the bend region of the printed circuit board.

A printed circuit board according to the invention can be part of a sensor group according to the invention, preferably for a keyless entry system of a motor vehicle. In addition to the printed circuit board, the sensor group can have the following: a carrier, electrical and/or electronic components, and an interface for connection to a vehicle electronic system.

The carrier can have first fastening elements in a first region and have second fastening elements in a second region, which are set up for fastening of the printed circuit board by a first fastening step in the first region of the carrier and a second fastening step in the second region of the carrier, wherein the printed circuit board is bent in the bend region during the second fastening step.

A bend, in particular a bend radius, for the printed circuit board can be defined by the fastening elements of the carrier and, in particular, their location.

A door handle according to the invention for a motor vehicle has a housing and a sensor group according to the invention. The sensor group can have a shape in which the antenna is placed a short distance from an outer surface of the door handle. The antenna can be placed approximately parallel to the outer surface of the door handle.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figures 1, 2, 3, 4:
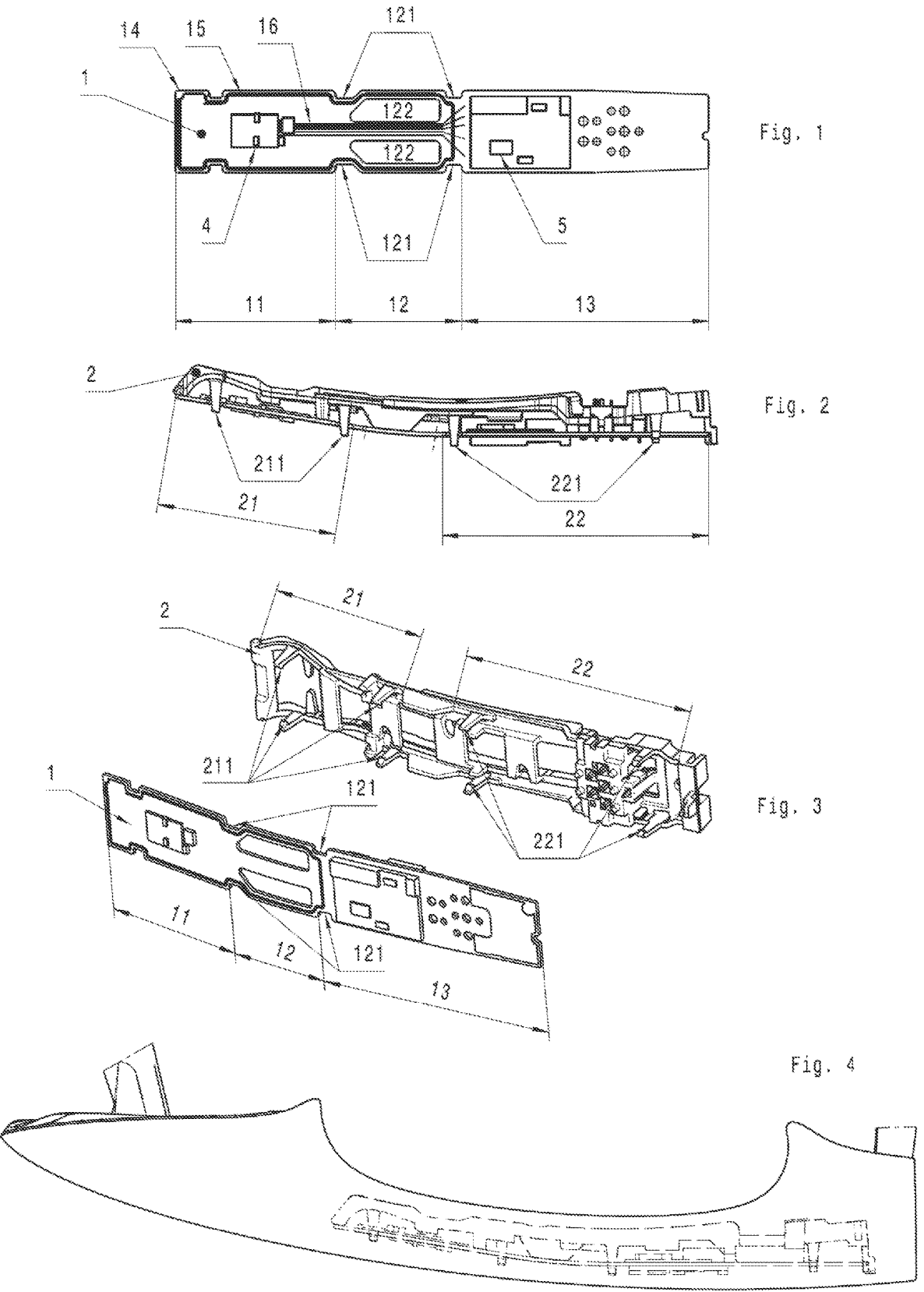
FIG. 1 shows a printed circuit board according to the invention in a top view.
FIG. 2 shows a sensor group according to the invention in a side view.
FIG. 3 shows a perspective view of a sensor group according to the invention with fastening steps indicated.
FIG. 4 shows a door handle according to the invention for a vehicle in a side view.

In FIG. 1, a printed circuit board 1 according to the invention is shown in a top view. The printed circuit board 1 is essentially rectangular in the top view and is designed to accommodate electrical and/or electronic components 4, 5. The printed circuit board 1 essentially has a first region 11, a second region 12, and a third region 13.

The first region 11 and the third region 13 can be used for the placement of electrical and/or electronic components 4, 5. The second region 12, located in the middle of the three regions 11, 12, 13, is intended as a bend region. A side edge 14 of the printed circuit board 1 is offset inward in this region in order to narrow the contour of the printed circuit board 1 in the bend region 12. This region likewise has one or more through holes 122. Both the narrowing 121 and the through holes 122 facilitate a bending of the printed circuit board 1, namely a bending of the first region 11 relative to the third region 13 or vice versa. The printed circuit board 1, which advantageously can be an FR4 printed circuit board, which are available inexpensively and in large quantities, is inherently too rigid to be bent without the risk of damage. The narrowing 121 and the through holes 122 make it easier to bend the printed circuit board 1 in the bend region 12. As a result, it is possible to bring the printed circuit board 1 into a desired shape.

Electronic components 4, 5 are provided on the printed circuit board 1 in the first and third regions 11, 13. The printed circuit board 1 has conductive traces that connect the electronic components 4, 5 to one another. In addition, a conductive trace 15, which is routed essentially in a loop along the side edge 14, is provided in the first region 11 and in the second region 12. This conductor loop forms an NFC antenna 15, which is connected through supply lines 16 to a circuit formed by the electronic components 4, 5.

A through hole 17 is provided in each of the corners of the first region 11 and of the third region 13; these through holes are used to fasten the printed circuit board 1 to a carrier 2.

The printed circuit board 1 populated with the components 4, 5 is assembled with a carrier 2 to form a sensor group 1, 2, 4, 5 (FIG. 2).

The carrier 2 has two regions 21, 22, in which fastening elements 211, 221 are provided. The fastening elements 211, 221 are posts at the free ends of which are provided latching structures. The posts have shoulders at a slight distance from the free ends. The free ends of the posts are inserted into the through holes 17 in the corners of the first and third regions 11, 13 of the printed circuit board 1, and the printed circuit board 1 is snapped onto the latching structures, with the printed circuit board 1 resting on the shoulders of the posts.

The shoulders of the fastening elements 211 of the first region 21 lie in a first plane, and the shoulders of the fastening elements 221 of the second region 22 lie in a second plane. The first plane and the second plane are at an angle to one another. A line of intersection is located between the two regions 21, 22, where the bend region 12 of the printed circuit board 1 fastened to the carrier is also located. This means that the printed circuit board 1 is bent in the region between the first region 21 and the second region 22 of the carrier 2, which is to say in the bend region, since otherwise the printed circuit board cannot rest on the shoulders lying in the first plane or the second plane.

The sensor group thus produced is placed in a housing 3 of a door handle (FIG. 4). As a result, the first region 11 and the second region 12, in which the NFC antenna 15 is formed, are parallel to and only a short distance away from an external surface of the housing 3.

The invention being thus described, it will be obvious that the same may be varied in many ways. Such variations are not to be regarded as a departure from the spirit and scope of the invention, and all such modifications as would be obvious to one skilled in the art are to be included within the scope of the following claims. cm What is claimed is:

What is claimed is:

1. A printed circuit board comprising:
   a bend region that has a narrowing and at least one through hole; and
   a side edge set back inward for the narrowing of the printed circuit board in the bend region.

2. The printed circuit board according to claim 1, wherein the printed circuit board is an FR4 printed circuit board.

3. The printed circuit board according to claim 1, wherein the printed circuit board has at least three regions including the bend region, wherein the bend region is a middle region of the at least three regions.

4. The printed circuit board according to claim 1, wherein an antenna or parts of the antenna are arranged in the bend region of the printed circuit board.

5. The printed circuit board according to claim 4, wherein the antenna includes supply lines that are arranged in the bend region of the printed circuit board.

6. The printed circuit board according to claim 4, wherein the antenna is an NFC antenna.

7. The printed circuit board according to claim 1, wherein the side edge of the printed circuit board is provided with two of the narrowing, and wherein the at least one through hole is elongated to extend between the two of the narrowing at the side edge.

8. A sensor group for a keyless entry system, comprising:
   a carrier;
   electrical and/or electronic components;
   an interface for connection to a vehicle electronic system; and
   a printed circuit board comprising a bend region that has a narrowing and at least one through hole, and a side edge set back inward for the narrowing of the printed circuit board in the bend region.

9. The sensor group according to claim 8, wherein the carrier has first fastening elements in a first region to retain a first region of the printed circuit board and the carrier has second fastening elements in a second region to retain a second region of the printed circuit board, wherein the printed circuit board is bent in the bend region when the printed circuit board is retained by the first and second fastening elements, the bend region provided between the first and second regions of the printed circuit board.

10. The sensor group according to claim 9, wherein a bend radius for the printed circuit board is defined by the first and second fastening elements of the carrier.

11. A door handle for a motor vehicle, comprising:
    a housing; and
    a sensor group for a keyless entry system, comprising:
    a carrier;
    electrical and/or electronic components;
    an interface for connection to a vehicle electronic system; and
    a printed circuit board comprising a bend region that has a narrowing and at least one through hole, and a side edge set back inward for the narrowing of the printed circuit board in the bend region.

12. The door handle according to claim 11, wherein the sensor group has a shape in which an antenna, that is provided on the printed circuit board, is positioned a short distance from an outer surface of the door handle.

13. The door handle according to claim 12, wherein the antenna is positioned approximately parallel to the outer surface of the door handle.

\* \* \* \* \*